United States Patent
Lukanc

(12) 
(10) Patent No.: US 6,615,400 B1
(45) Date of Patent: Sep. 2, 2003

(54) OPTIMIZING DENSE VIA ARRAYS OF SHRUNK INTEGRATED CIRCUIT DESIGNS

(75) Inventor: Todd P. Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 109 days.

(21) Appl. No.: 09/774,710

(22) Filed: Feb. 1, 2001

(51) Int. Cl.[7] ............................................... G06F 17/50
(52) U.S. Cl. .............................. 716/11; 716/14; 716/1
(58) Field of Search .................... 716/1, 11, 14

(56) References Cited

U.S. PATENT DOCUMENTS 6,016,357 A  *  1/2000  Neary et al. ............... 382/144
6,247,853 B1 *  6/2001  Papadopoulou et al. ...... 716/19
6,317,859 B1 * 11/2001  Papadopoulou ............. 700/110

\* cited by examiner

*Primary Examiner*—Matthew Smith
*Assistant Examiner*—Brandon Bowers

(57) ABSTRACT

A method and apparatus for replacing dense via arrays in shrunk, electronic device designs involves identifying vias on the same node within the electronic device design. Once vias are identified as on the same node, the combined area of the vias is calculated. Based upon the combined area of the identified vias, a determination of how many new, larger vias to create is made. New vias that are larger than the originally identified vias are created in such a number that the total area of the new vias at least equals the combined area of the originally identified vias. The new via array, having greater spacing between individual vias than the original via array, is used to replace the original via array within the electronic device design.

14 Claims, 4 Drawing Sheets

OPTIMIZING DENSE VIA ARRAYS OF SHRUNK INTEGRATED CIRCUIT DESIGNS

FIELD OF THE INVENTION

The present invention relates to electronic device design, and particularly to the layout of vias for electronic circuits.

DESCRIPTION OF RELATED ART

Electronic devices, particularly integrated circuits, comprise a large number of components fabricated by layering several different materials onto a silicon wafer. In order for the components to function as an electronic device, they are selectively, electrically connected to one another. Metal lines are utilized to electrically connect components. The metal lines provide electrical connection within a layer, while vias connect different metallization and via layers. It is important that a good connection between the via and metal line exists in order to ensure that the proper amount of current is carried with minimal resistance between the connected components.

When designing an electronic device, a designer creates a circuit description, including electrical connection of the components. The circuit description is input into a computer aided design (CAD) software package to form a three-dimensional geometric image of the electronic device, known as a layout. Software vending companies such as Cadence, Mentor Graphics, and Integrated Silicon Systems provide CAD software specially designed for electronic device design and manufacture.

Typically, a CAD system for designing electronic devices contains several components to assist with circuit design, for example: a schematic editor, a logic compiler, a logic simulator, a logic verifier, and a layout program. The schematic editor allows designers to create and/or modify a schematic diagram, i.e., circuit description, using the computer's display and input devices, and generates a net list, i.e., a summary of connections between components, in the process. The logic compiler receives the net list as input, and utilizing a component database, writes the necessary information for layout, verification, and simulation into a schematic object file having a format specifically optimized for layout, verification, and simulation. The logic verifier checks the schematic diagram for design errors, such as multiple outputs connected together, overloaded signal paths, etc., and generates error indications if any such design problems exist. The logic simulator uses the schematic object file and simulation models created by the designer, and generates a set of simulation results, based upon instructions, initial conditions, and input signal values provided either in the form of a file or as user input.

The layout program generates geometric data from which a semiconductor chip, circuit board, integrated circuit, or other electronic device is laid out and produced. Generally, a layout comprises a set of geometric shapes contained in several layers. In a layout, metal lines are represented as trenches in a layer, and vias are represented as holes in a layer. Typically, the layout is checked to ensure that it meets all of the design requirements, e.g., that there are a sufficient number of vias between a particular upper metal line and a lower metal line to carry the requisite current between the metal lines. The result is a set of design files that describes the layout. The design files are then converted into pattern generator files used to produce patterns by an optical or electron beam pattern generator that are called masks. Masks are then utilized to print the layout onto a wafer using photolithography techniques.

Current CAD programs for designing electronic devices automate the process of generating an electronic device layout, but do not address many problems related to electronic device layouts. A difficult problem relating to via spacing and arrangement arises as electronic device sizes continue to shrink. In the past, an electronic device layout was large enough to accommodate vias with a sufficient size that the vias would fill properly, i.e., without voids and other defects in the metal filling the via hole, when the electronic device was manufactured. Today, with electronic device designs, and individual electronic device components such as vias, becoming increasingly smaller and smaller, reliable filling of vias during manufacture is no longer assured. Partially filled vias result in less current connecting electronic device components, leading to underpowered components and slower operation of the electronic device. Partially filled vias also increase the resistance to electrical flow, leading to overheating problems and possible burnout of an electronic device.

Along with decreased sizes of components, shrunk electronic device designs also require individual components to be spaced closer together than ever before. For vias, close spacing raises the possibility of bridging between vias during manufacture of the electronic device. When bridging or partial bridging occurs between vias that are on the same node, i.e., carry electric current between the same metal lines, excess defect generation during inspection results. Excess defect generation increases the amount of time spent performing inspection of an electronic device, thus increasing the cost of producing the device.

SUMMARY OF THE INVENTION

There is a need for modifying dense via arrays in electronic device design layouts in order to prevent filling problems for the vias within dense via arrays. There is also a need for modifying dense via arrays in order to reduce defect generation issues during inspection of electronic devices.

These needs and others are met by embodiments of the present invention, which provide a method and apparatus for identifying particular via arrays in an electronic device layout where the vias in an array are on the same node. Based upon the combined area of the vias within a via array on the same node, the present invention replaces the vias in the via array with a lesser number of vias, each of which is larger than the original vias, such that the total area of the vias is unchanged, or is greater. Embodiments of the present invention use aerial image simulations of the printed resist patterns to calculate the total area of the vias in the original via array, and also use aerial image simulations of the printed resist patterns to calculate the total area of the via area after the original vias have been replaced with larger vias. The final results on a wafer are larger vias that print and fill without issues, and have sufficient spacing so as to prevent bridging.

Accordingly, one aspect of the invention relates to a method for resizing vias in an electronic device design. The method identifies vias that each contact a pair of metal lines, then determines the combined area of the identified vias. At least one polygon is created wherein the area of the at least one polygon is at least as large as the combined area of the identified vias. The identified vias are replaced with at least a via that is defined by the at least one polygon.

In certain embodiments, aerial image simulations are utilized to determine the combined area of the identified vias, as well as the area of the vias defined by the at least one polygon.

Another aspect of the present invention relates to a computer system comprising a processor, a display connected to the processor, an input device connected to the processor, and a cursor control device connected to the processor. The processor carries out instructions for creating a design layout for an electronic device. The processor further carries out instructions for resizing vias in the design of an electronic device. Resizing vias is carried out by identifying vias that each contact a pair of metal lines, and determining the combined area of the identified vias. At least one polygon is created wherein the area of the at least one polygon is the same as the combined area of the identified vias. The identified vias in the design are replaced with at least a via that is defined by the at least one polygon.

Another aspect of the present invention relates to a computer readable medium bearing instructions for processing a computer-generated electronic device layout. The instructions contained on the computer readable medium, when executed, are arranged to cause a computer system to identify vias that each contact a pair of metal lines, and determine the combined area of the identified vias. The instructions create at least one polygon having at least as large a combined area as the combined area of the identified vias, and replace the identified vias with at least a via defined by the at least one polygon.

Replacing a via array composed of small vias that connect two metal lines with a via array composed of larger vias connecting the same two metal lines greatly improves the electronic device manufactured from the electronic device layout without substantially increasing the design time or cost of manufacturing the electronic device. This is accomplished by creating via arrays where the individual vias are spaced far enough apart to prevent bridging concerns during manufacture, are large enough that they will completely fill, with copper or other conductive metal for example, and are more easily printed because of their larger size.

Additional advantages and novel features of the invention will be set forth in part in the description which follows, and in part will become apparent to those skilled in the art upon examination of the following or may be learned by practice of the invention. The advantages of the invention may be realized and attained by the instrumentalities and combinations, particularly pointed out in the appended claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention addresses and solves problems related to dense via arrays having small vias in shrunk electronic device designs. The present invention also addresses and solves problems related to filling without voids within a copper column, or column of other electrically conductive metal, and inspection problems associated with vias in shrunk electronic devices during manufacture of the electronic devices. This is achieved by providing a method for identifying vias on the same node, and replacing those identified vias with fewer, but larger vias having at least the same current handling capacity. Such larger vias solve problems associated with printing via arrays on a wafer due to photolithographic resolution, and make via arrays more reliably manufactured by reducing filling problems and inspection concerns connected to bridging due to the larger via size and greater spacing between individual vias, respectively.

Figure 1:
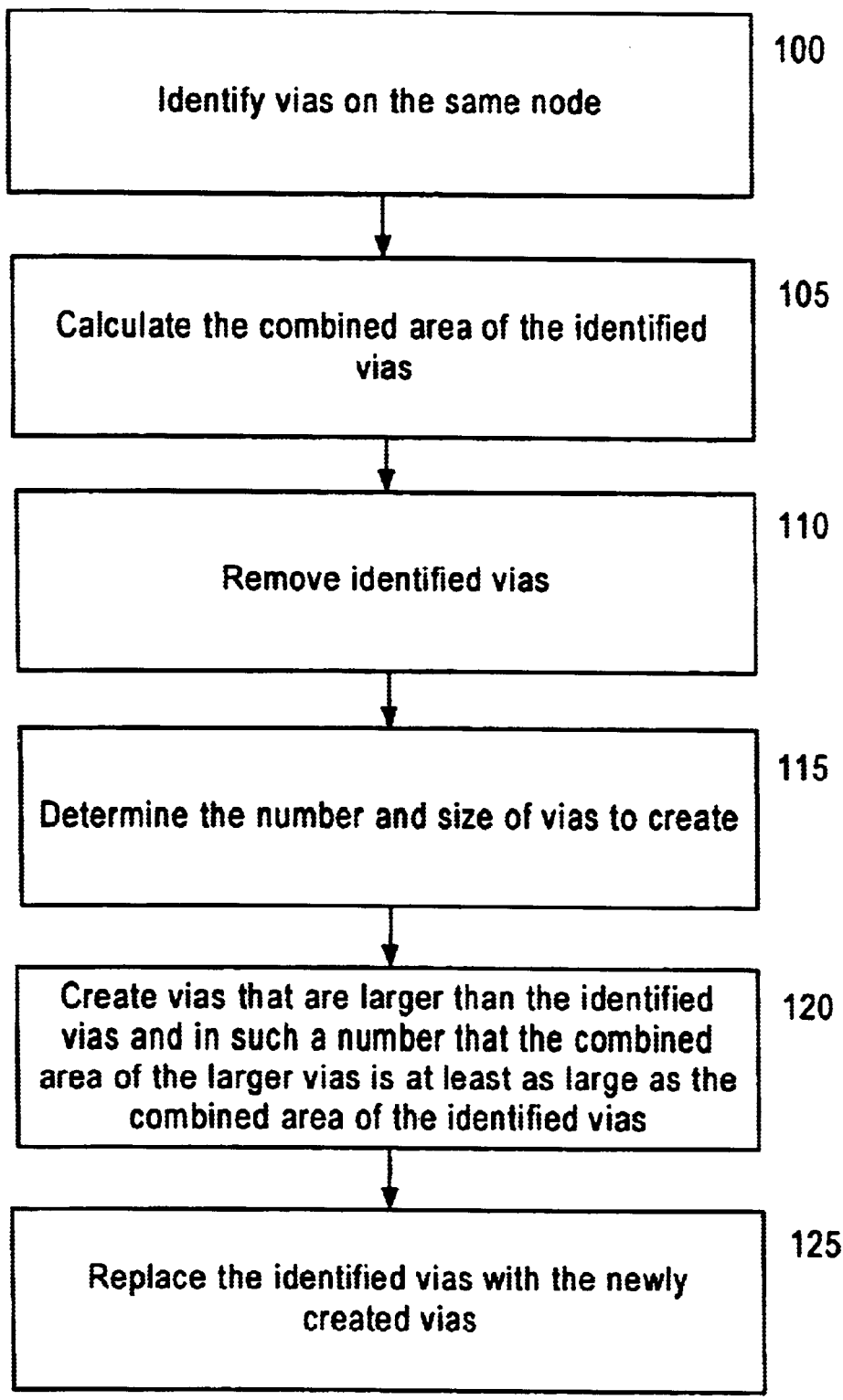
FIG. 1 is a processing flow of an embodiment of the present invention.
Figure 2:
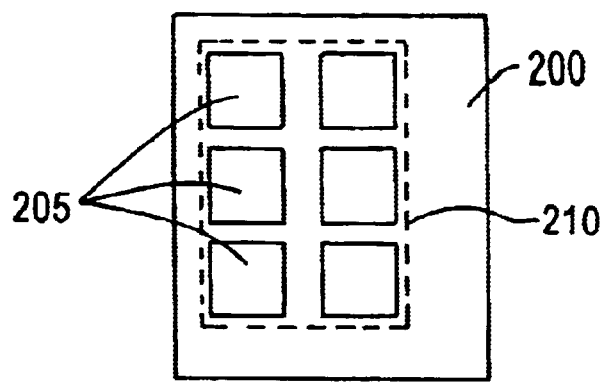
FIG. 2 is a top view of a via array comprising small vias.
Figure 3:
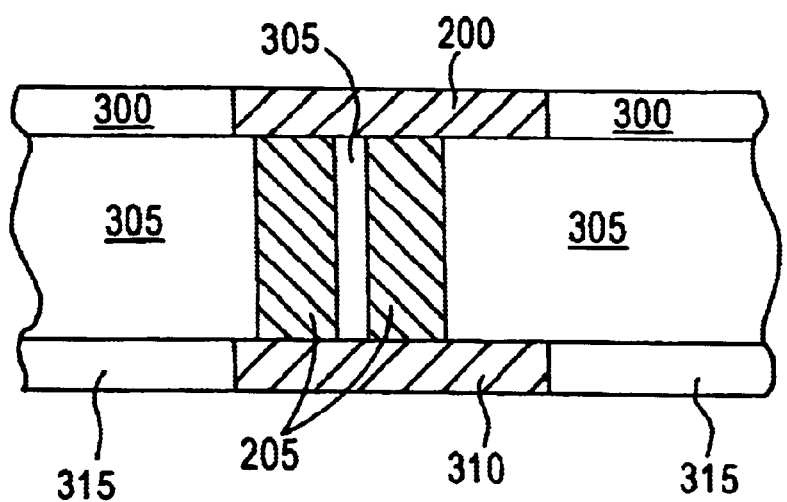
FIG. 3 is a front sectional view of the via array in FIG. 2.

Referring now to the drawings and initially to FIG. 1, an inventive method for replacing small vias in a via array with larger vias is described. Once a layout for an electronic device has been created by circuit designers, vias connected to the same node are identified at step 100. For example, geometric manipulation software such as Mentor Graphics Calibre SVRF is used to identify those individual vias 205 (FIG. 2) of a via array that electrically connect the same two metal lines, e.g., metal line 200 and metal line 310 (FIG. 3). FIG. 3 depicts an arrangement where metal line 200 is surrounded by electrically insulating material 300, vias 205 are surrounded by electrically insulating material 305, and metal line 310 is surrounded by electrically insulating material 315. In certain embodiments of the invention, the original vias 205 are square and all of the same size, as depicted in FIG. 2. Note that the arrangement of FIG. 2 is not actually physically constructed. Rather, this arrangement is what would be constructed at this early design phase, without the via combining provided by the present invention. Hence, the arrangement of FIG. 2 represents a virtual construct.

Once vias 205 are identified, the combined area of the identified vias 205 is calculated at step 105. An exemplary manner of calculating the combined area of the identified vias 205 is to use aerial imaging software to determine the printed area of each via 205 based upon the layout size of each via 205. Another exemplary method is to use the geometric manipulation software that was used to identify the vias 205 to calculate the area of the vias 205 in the layout. In certain embodiments, a perimeter 210 around the originally identified vias 205 is determined by using, for example, geometric manipulation software. The size of, and location of perimeter 210 is retained for later use. Perimeter 210 establishes the boundary of the original via array, and is later used to assist with placement of the new via array into the electronic device design as described below.

After the area of each via 205 has been determined, the individual areas are summed to determine a combined via area. After calculating the combined area of the identified vias 205 at step 105, the identified vias 205 are removed from the circuit design layout at step 110. An exemplary process for removing the identified vias 205 from the circuit design layout is to use geometric manipulation software such as Mentor Graphics Calibre SVRF or other similar programs.

Figure 4:
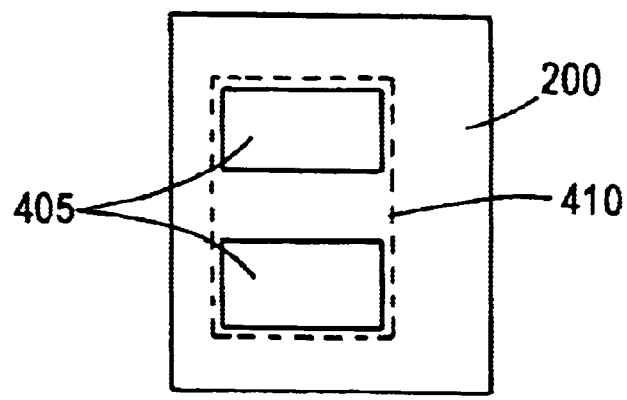
FIG. 4 is a top view of a via array comprising larger vias.
Figure 5:
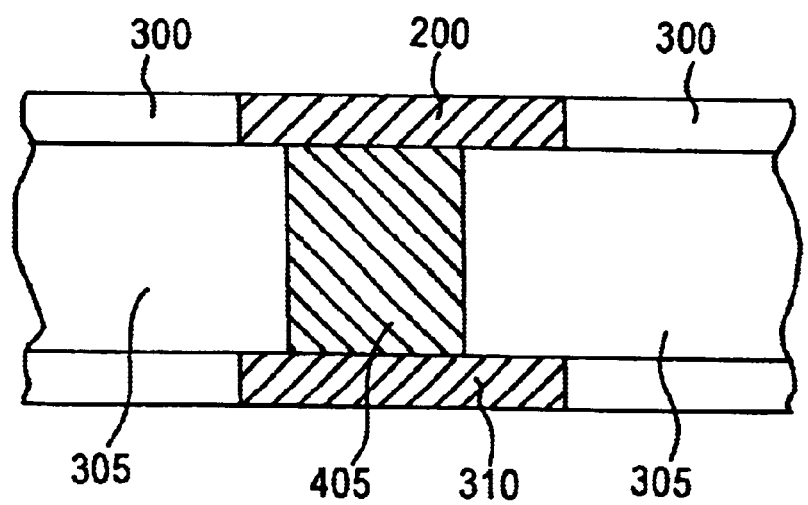
FIG. 5 is a front sectional view of the via array of FIG. 4.

At step 115 a determination is made as to the number and size of vias 405 (FIG. 4) to create to replace the originally identified vias 205. Several factors are taken into consideration when determining how many and what size of larger vias 405 to create for replacing the identified vias 205. One factor is the combined area of the identified vias 205 that was calculated at step 105. The combined area of the newly created vias 405 is such that it is equal to or greater than the combined area of the originally identified vias 205. Making the combined area of the new vias 405 equal to or greater than the combined area of the originally identified vias 205 ensures that at least the same current handling capacity is maintained between the metal lines 200, 310 contacted by the vias 405 (FIG. 5). If the combined area of the newly created vias 405 is greater than the combined area of the originally identified vias 205, then the current handling capacity of the via array is increased, which enhances the performance characteristics of the electronic device containing the newly created vias 405.

Another factor considered at step 115 is the relative size increase of the newly created vias 405 compared to the size of the original vias 205. Not all vias (not shown) within the electronic device layout will be resized by the present invention, therefore, newly created vias 405 should not be too much larger than the original vias 205 in order to maintain wafer printing and via filling consistencies between the different sized vias (not shown) during manufacture of the electronic device. A rough estimate of an appropriate size is to make the new vias 405 approximately two to three times larger than the original vias 205. For example, this is accomplished by making polygons that represent the new vias 405 in the electronic device layout where the polygons are twice as large as the original vias 205 in the electronic device layout. When the new vias 405, defined by the polygons, print onto the wafer the new vias 405 will be roughly three times the size of the original vias 205 because of photolithography characteristics. Accordingly, polygons that are less than twice the original size of vias 205 in the electronic device layout result in new vias 405 that are between two to three times as large as the original vias 205. In addition to a rough estimate of an increased size of two to three times for the newly created vias 405, simulation and experimental data is collected from the electronic device layout using well-known techniques, for example, using CAD software provided by Cadence, Mentor Graphics, Integrated Silicon Systems, or other well-known CAD providers, and an appropriate size of the newly created vias 405 for the technology embodied in the electronic device layout is determined from the data. Well-known parameters and characteristics for each technology that forms an electronic device dictate how much size variance can occur among components.

In certain embodiments, aerial imaging is used to determine the size of the polygons that define the new vias 405 in the layout. For example, aerial imaging is used to determine the printed size on the wafer of the new vias 405, and using well-known techniques, the layout size of the new vias 405 is determined taking into account photolithography effects that occur when a mask made from the layout is used to print the electronic device features onto a wafer. In yet other embodiments, aerial imaging software is used to optimize the size of the polygons defining new vias 405 in the layout and the spacing between the polygons defining the new vias 405, taking into account simulation and experimental data collected from the electronic device layout, and the technology embodied in the electronic device layout.

At step 120, new vias 405 that are larger than the originally identified vias 205 are created based upon the number and size data determined at step 115. The number and size of the newly created vias 405 is such that the combined area of the new vias 405 at least equals the combined area of the originally identified vias 205. An exemplary manner for creating the new vias 405 is to use geometric manipulation software, for example, Mentor Graphics Calibre SVRF or other similar program to create polygons whose size and number created are based upon the determinations made at step 115. The newly created vias 405 could have any of a number of shapes for a cross-section, but printing characteristics of the shapes should be taken into consideration. For example, the originally identified vias 205 typically have a square cross-section that has well-known printing characteristics, i.e., that the corners will be rounded resulting in a circular via on the wafer with a smaller area than the layout square. In certain embodiments, the originally identified vias 205 are readily replaced by new vias 405 having a rectangular cross-section, which also has well-known printing characteristics, i.e., that the longer sides of the rectangle are going to bow outward resulting in a slightly oval shaped via on the wafer with a larger area than the layout rectangle.

At step 125 the newly created polygons defining vias 405 are inserted into the electronic device layout, replacing the originally identified vias 205 that were removed from the electronic device design. When the newly created vias 405 are inserted into the layout, a consideration to account for is keeping the perimeter 410 of the new via array within the perimeter 210 of the original via array. As noted supra, the location information of original perimeter 210 was retained. The location information of perimeter 210 is useful to ensure that the new vias 405 are placed into the electronic device layout in a position where they will not adversely affect non-resized vias (not shown). For example, referring to FIG. 4, the perimeter 410 around the vias 405 is smaller than the perimeter 210 (FIG. 2) around the vias 205. Keeping the perimeter 410 of the new via array within the bounds of the original via array's perimeter 210 ensures that the new vias 405 will be spaced far enough from vias that were not resized (not shown) to prevent bridging between the new vias 405 and the vias that were not resized (not shown). Such spacing, for example, is determined through aerial imaging and optimized using aerial imaging techniques in certain embodiments.

An additional advantage that results from combining a number of small vias into a lesser number of larger vias is that defect generation during inspection is reduced. During inspection of an electronic device, any structure that is different, such as marginally bridging vias or vias with variable sizes, is detected by the automatic inspection system. Often, a dense array of vias on the same node in a shrunk design generates defects that are detected by the inspection system, especially where the vias have been placed very close to one another in order to maximize current flow or to minimize the resistance. Replacing a dense array of small vias with a less dense array of larger vias results in fewer marginally bridging vias or vias with variable sizes, thus reducing the number of defects that are generated during inspection.

Hardware Overview

Figure 6:
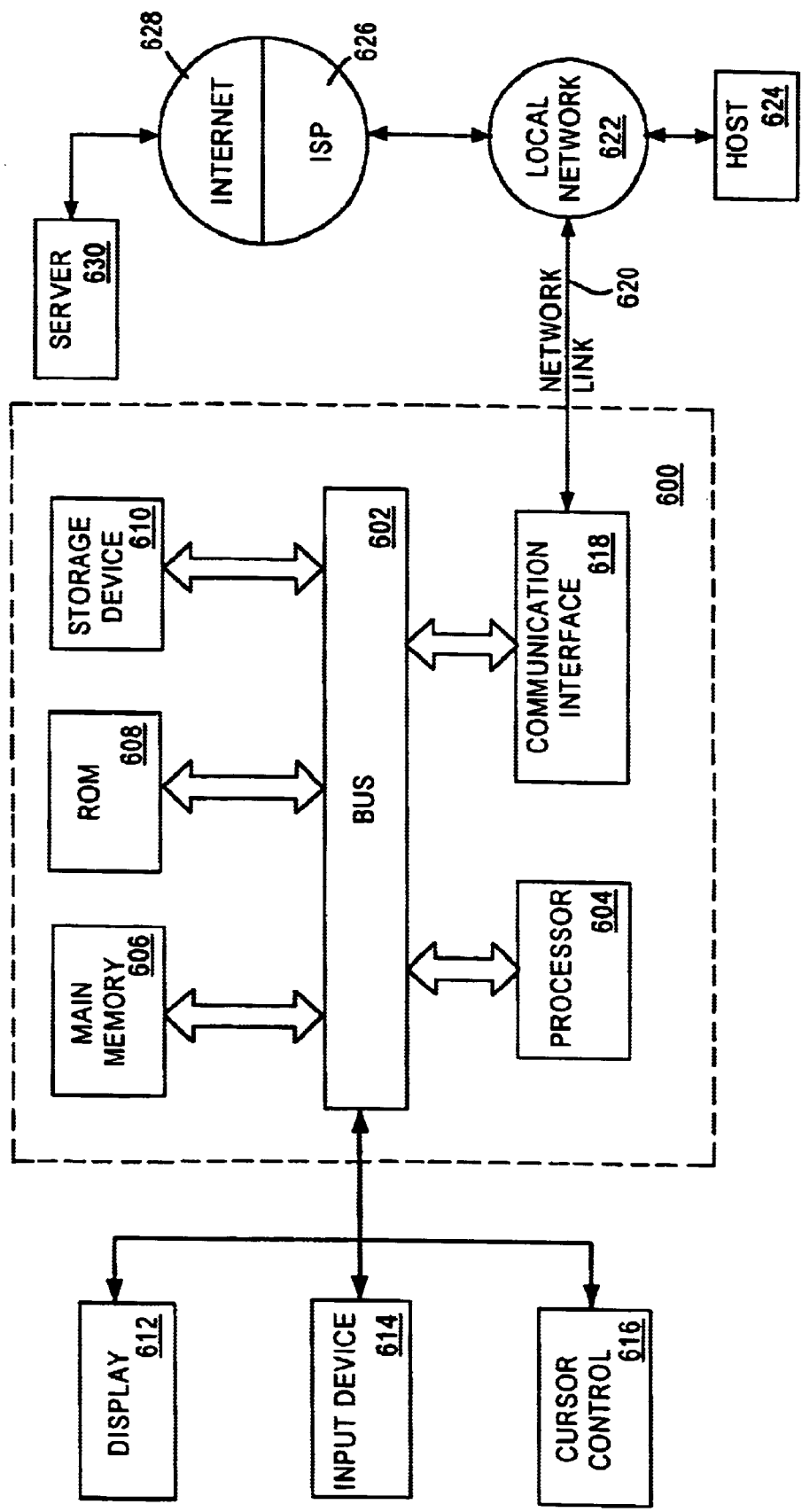
FIG. 6 is a schematic diagram of an exemplary computer system on which the embodiment depicted in FIG. 1 runs.

FIG. 6 is a block diagram that illustrates an exemplary computer system 600 upon which an embodiment of the invention may be implemented. Computer system 600 includes a bus 602 or other communication mechanism for communicating information, and a processor 604 coupled with bus 602 for processing information. Computer system 600 also includes a main memory 606, such as a random access memory (RAM) or other dynamic storage device, coupled to bus 602 for storing information and instructions to be executed by central processor 604. Main memory 606 also may be used for storing temporary variables, such as perimeter 210 (FIG. 2), or other intermediate information during execution of instructions to be executed by processor 604. Computer system 600 further includes a read only memory (ROM) 608 or other static storage device coupled to bus 602 for storing static information and instructions for central processor 604. A storage device 610, such as a magnetic disk or optical disk, is provided and coupled to bus 602 for storing information and instructions.

Computer system 600 may be coupled via bus 602 to a display 612, such as a cathode ray tube (CRT), for displaying information to a computer user. An input device 614, including alphanumeric and other keys, is coupled to bus 602 for communicating information and command selections to central processor 604. Another type of user input device is cursor control 616, such as a mouse, a trackball, or cursor direction keys for communicating direction information and command selections to central processor 604 and for controlling cursor movement on display 612. This input device typically has two degrees of freedom in two axes, a first axis (e.g., x) and a second axis (e.g., y), that allows the device to specify positions in a plane. Input devices allow a designer to interact with a schematic editor to create and/or modify circuit descriptions. The input devices also allow a designer to manually select specific vias to resize should a designer desire to do so.

The invention is related to the use of computer system 600 for checking a computer generated electronic device layout for vias that are on the same node. The invention uses computer system 600 to remove vias on the same node from the electronic device layout, and replace those vias with a lesser number of larger vias that have at least the same current handling capacity and increased spacing between individual vias. According to certain embodiments of the invention, removing vias from a node and replacing them with fewer, but larger vias is provided by computer system 600 in response to central processor 604 executing one or more sequences of one or more instructions contained in main memory 606. Such instructions may be read into main memory 606 from another computer-readable medium, such as storage device 610. Execution of the sequences of instructions contained in main memory 606 causes central processor 604 to perform the process steps described supra. One or more processors in a multi-processing arrangement may also be employed to execute the sequences of instructions contained in main memory 606. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to central processor 604 for execution. Such a medium may take many forms, including but not limited to, non-volatile media, volatile media, and transmission media. Non-volatile media include, for example, optical or magnetic disks, such as storage device 610. Volatile media include dynamic memory, such as main memory 606. Transmission media include coaxial cables, copper wire and fiber optics, including the wires that comprise bus 602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

Various forms of computer readable media may be involved in carrying one or more sequences of one or more instructions to central processor 604 for execution. For example, the instructions may initially be borne on a magnetic disk of a remote computer. The remote computer can load the instructions into its dynamic memory and send the instructions over a telephone line using a modem. A modem local to computer system 600 can receive the data on the telephone line and use an infrared transmitter to convert the data to an infrared signal. An infrared detector coupled to bus 602 can receive the data carried in the infrared signal and place the data on bus 602. Bus 602 carries the data to main memory 606, from which central processor 604 retrieves and executes the instructions. The instructions received by main memory 606 may optionally be stored on storage device 610 either before or after execution by central processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the worldwide packet data communication network, now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are exemplary forms of carrier waves transporting the information.

Computer system 600 can send messages and receive data, including program code, through the network(s), network link 620, and communication interface 618. In the Internet example, a server 630 might transmit a requested code for an application program through Internet 628, ISP 626, local network 622 and communication interface 618. In accordance with the invention, one such downloaded application provides for checking a computer generated electronic device layout for vias on the same node and replacing such vias with fewer, but larger vias as described herein.

The received code may be executed by central processor 604 as it is received, and/or stored in storage device 610, or other non-volatile storage for later execution. In this manner, computer system 600 may obtain application code in the form of a carrier wave.

The present invention may be embodied in a computer system as described above, or it may be a program designed to operate on any configuration for a computer system.

While this invention has been described in connection with what is presently considered to be the most practical and preferred embodiment, it is to be understood that the invention is not limited to the enclosed embodiments, but, on the contrary, is intended to cover various modifications and equivalent arrangements included within the scope of the appended claims.

What is claimed is:

1. A method for resizing vias in an electronic device design comprising the steps of:

identifying vias that each contact a pair of metal lines;

determining the combined area of the identified vias;

creating multiple polygons wherein the area of the multiple polygons is at least as large as the combined area of the identified vias; and replacing the identified vias with a plurality of vias defined by the multiple polygons and spacing between the plurality of vias defined by the multiple polygons is greater than spacing between the identified vias.

2. The method according to claim 1, wherein:

the cross-section of each of the identified vias is square; and the cross-section of the multiple polygons is rectangular.

3. The method according to claim 1, wherein:

aerial image simulations are utilized to determine the combined area of the identified vias.

4. The method according to claim 1, wherein:

aerial image simulations are utilized to determine the area of the multiple polygons.

5. The method according to claim 4, wherein determining the area of the multiple polygons further comprises:

optimizing the aerial image simulations to create design layouts with vias defined by the multiple polygons that have a size and spacing that account for the technology embodied in the design layout and simulated and experimental data.

6. The method according to claim 1, wherein:

the identified vias and the vias defined by the multiple polygons are designed to be filled with copper.

7. A computer system comprising:

a processor;

a display connected to the processor by a bus;

an input device connected to the processor by the bus; and a cursor control device connected to the processor by the bus; wherein the processor carries out instructions for creating a-design layout for an electronic device; and the processor further carries out instructions for resizing vias in the design of an electronic device comprising the steps of:

identifying vias that each contact a pair of metal lines;

determining the combined area of the identified vias;

creating multiple polygons wherein the area of the multiple polygons is at least as large as the combined area of the identified vias; and replacing the identified vias with a plurality of vias defined by the multiple polygons and spacing between the plurality of vias defined by the multiple polygons is greater than spacing between the identified vias.

8. The computer system of claim 7, wherein:

the processor utilizes aerial image simulations to determine the combined area of the identified vias.

9. The computer system of claim 7, wherein:

the processor utilizes aerial image simulations to determine the area of the multiple polygons.

10. The computer system of claim 7, wherein:

the processor optimizes the aerial image simulations to create design layouts with vias defined by the multiple polygons that have a size and spacing that account for the technology embodied in the design layout and simulated and experimental data.

11. A computer-readable medium bearing instructions for processing a computer generated electronic device, layout, said instructions, when executed, are arranged to cause a computer system to perform the steps of:

identifying vias that each contact a pair of metal lines;

determining the combined area of the identified vias;

creating multiple polygons wherein the area of the multiple polygons is at least as large as the combined area of the identified vias; and replacing the identified vias with a plurality of vias defined by the multiple polygons and spacing between the plurality of vias defined by the multiple polygons is greater than spacing between the identified vias.

12. The computer-readable medium of claim 11, wherein:

the processor utilizes aerial image simulations to determine the combined area of the identified vias.

13. The computer-readable medium of claim 11, wherein:

the processor utilizes aerial image simulations to determine the area of the multiple polygons.

14. The computer-readable medium of claim 11, wherein:

the processor optimizes the aerial image simulations to create design layouts with vias defined by the multiple polygons that have a size and spacing that account for the technology embodied in the design layout, and simulated and experimental data.

* * * * *